(12) United States Patent
Dutta

(10) Patent No.: US 6,441,455 B1
(45) Date of Patent: Aug. 27, 2002

(54) LOW DOSAGE FIELD RINGS FOR HIGH VOLTAGE SEMICONDUCTOR DEVICE

(75) Inventor: Ranadeep Dutta, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 08/812,848

(22) Filed: Mar. 6, 1997

(51) Int. Cl.$^7$ ................................................ H01L 23/58
(52) U.S. Cl. ........................ 257/490; 257/494; 257/495
(58) Field of Search .................... 257/341, 490, 257/494, 495

(56) References Cited

U.S. PATENT DOCUMENTS 5,629,552 A * 5/1997 Zommer ...................... 257/490

OTHER PUBLICATIONS

"Semiconductor Devices—Physics and Technology" by S.M. Sze, p. 405–p. 415, 1985.*

* cited by examiner

*Primary Examiner*—Steven Loke
(74) *Attorney, Agent, or Firm*—Ostrolenk, Faber, Gerb & Soffen, LLP

(57) ABSTRACT

The active area of a semiconductor die is surrounded by a plurality of concentrically spaced ring shaped P type diffusions. The diffusions have a low concentration produced by a total boron implant dose of from about 2E12 to 5E13 atoms/cm$^2$. Four to twelve rings are used to terminate an active area at a potential of 600 to 1200 volts with respect to the die street.

14 Claims, 1 Drawing Sheet

LOW DOSAGE FIELD RINGS FOR HIGH VOLTAGE SEMICONDUCTOR DEVICE

FIELD OF THE INVENTION

This invention relates to structures for terminating the active area of a high voltage semiconductor device, and more specifically relates to novel, concentric and very low dose field rings which surround a device active area.

BACKGROUND OF THE INVENTION

High voltage semiconductor devices such as power MOSFETs, IGBTs, diodes and Schottky diodes all have an active central area consisting of appropriate diffusions in the top surface of a semiconductor die. The main electrode of a device may be at a high potential relative to the die peripheral edge and the peripheral top surface surrounding the high potential active area.

To prevent breakdown of the silicon surface surrounding the active region due to high lateral electric fields, it is necessary to terminate the active region periphery. Conventional terminations include spaced concentric diffused rings, for example, $P^+$ diffusions in an $N^-$ epitaxially grown body which receives the active diffusions, spaced conductive ring-shaped field plates which surround the active region, or a combination of ring-shaped field plates and ring-shaped diffusions.

The purpose of the diffused rings and field plates is to gradually spread the electric field laterally between the periphery of the active region and the die periphery to ensure that the lateral field is sufficiently low to prevent avalanche breakdown at the die-peripheral surface.

Prior art field plates and diffused rings require that large surface areas be employed for a given die. It is desirable to reduce the area required for the terminal structure since die cost is approximately proportional to the die area.

Field plates, for example, aluminum field plates take up considerable area because they have a given width and require spacing from one another. Further, field plates are subject to damage. For example, in a fast recovery diode device designed to withstand a reverse voltage of 600 volts, four metal rings have been used atop and in contact with underlying $P^+$ diffusions in an $N^-$ epitaxially formed surface. These rings have about a 4 micron thickness, a radial width of about 35 microns, and a spacing of about 6 microns. Thus, a substantial area is required for the field plate structure in conventional structures.

Diffused $P^+$ rings in an $N^-$ epitaxial surface are also commonly used. These rings commonly have a high doping concentration, for example, a concentration produced by ion implanting with a boron dose of 7E14 to 1E16 atoms/cm$^2$ and diffused to a depth of about 6 microns. Six such concentric rings may be used with constant or graduated spacings of from about 15 to 25 microns each. Thus, a substantial amount of area is also required for this type of termination.

BRIEF DESCRIPTION OF THE INVENTION

In accordance with the invention, very lightly doped concentric field rings are used for a high voltage device termination. More specifically, a boron implant dose (preferably from 2E12 to 5E13 cm$^2$) is used to form each of a plurality of spaced concentric termination diffusions in an $N^-$ substrate.

Lower doses, such as "resurf" doses of 3E11 to 5E11 cm$^2$ are disclosed in U.S. Pat. No. 4,750,028 for termination rings. These doses, however, are so low that they are very difficult to control. Further, these ultra low doses permit the diffusion ring to fully deplete which could possibly permit punch-through failure to the silicon surface.

The high concentration usually used for termination rings, of 7E14 to 1E16 ions/cm$^2$ causes a high electric field at the silicon surface and requires additional area for disposal of space field plates between diffusions in order to achieve proper reliability. By contrast, the novel low dose rings of the invention can be very narrow (about 2 microns), which low dose rings tend to move the electric field into the bulk of the wafer and away from its surface.

Advantageously, the low dose rings of the present invention lower the electric field at the surface of the die. By contrast, the high electric field at the surface of the die of prior art diffused rings can cause premature surface breakdown and cause the characteristics of the device to be undesirably sensitive to surface preparation conditions.

Thus, the low dose rings of the present invention provide a reduced area termination for a given die and is more reliable than prior designs.

Other features and advantages of the present invention will become apparent from the following description of the invention which refers to the accompanying drawings.

DETAILED DESCRIPTION OF THE INVENTION

Figure 1:
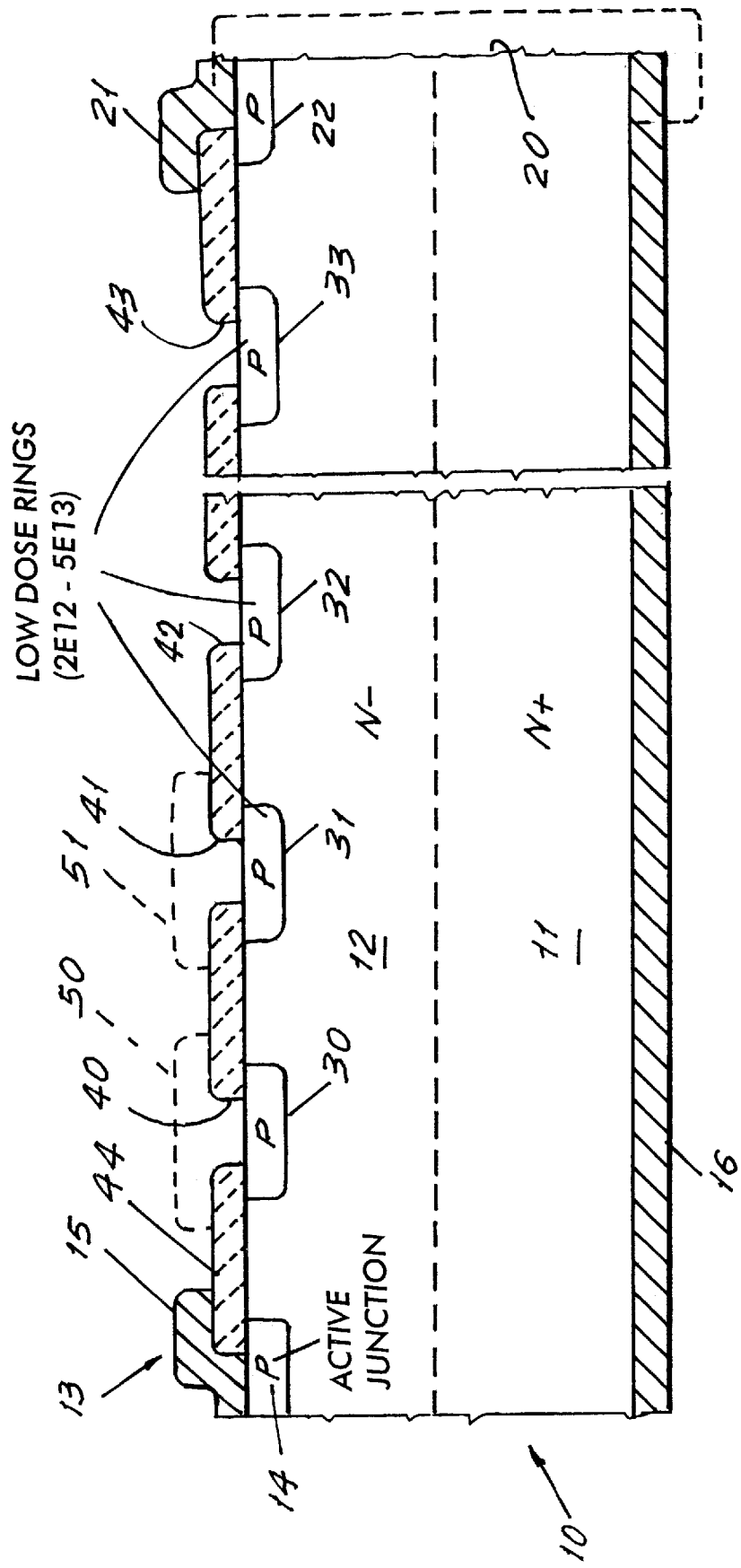
FIG. 1 is a cross-section of a die having a termination area made in accordance with the present invention.

Referring to FIG. 1, there is shown the edge portion of a die 10 having the termination structure of the preferred embodiment of the invention. Die 10 consists of a main body 11 of monocrystalline silicon doped to a high concentration ($N^+$). An epitaxial silicon layer 12 of low concentration (depending upon the desired breakdown voltage of the device) is grown atop layer 11 and is the layer into which junctions are diffused to define the device to be made. Thus, the device has a main active area 13 which consists of an enclosed area containing junctions and electrodes to define the device as a power MOSFET, IGBT, diode or the like. Only one outer section of the active area 13 which encloses the active area is shown in FIG. 1 and consists of the outer boundary of a P type diffusion 14 and an aluminum electrode 15 thereon. Another electrode 16 is formed on the bottom of die 11.

In one example of the invention, the structure described can be a diode in which electrodes 15 and 16 are the anode and cathode electrodes respectively. The active area could, of course, be that of any other desired semiconductor device.

In a high voltage device where the anode potential could be about 600 to 1200 volts relative to the potential of the edge or street 20 of die 10, it is necessary to spread out the electric field at the surface of the device between the periphery of the active region and the street 20. Note that street 20 has an electrode 21 which is in contact with $N^+$ diffusion 22 and is at the potential of electrode 16.

In accordance with the invention, a plurality of concentric spaced P type ring diffusions 30, 31, 32 and 33 surround the active region. In a 1200 volt device, twelve P rings are preferred; however, the invention contemplates other numbers of rings.

Rings 30 to 33 are formed by implanting boron through ring-shaped windows 40, 41, 42 and 43 respectively in oxide layer 44. Note that the edges of anode electrode 15 and of electrode ring 21 step up and over the edge of oxide layer 44 to define field plates.

In accordance with the invention, P diffusions 30 to 33 have a sufficiently high concentration (preferably above about 2E12 cm$^2$) to prevent complete depletion of the rings at full reverse voltage which would permit punch through breakdown of the regions. The implant concentration in regions 30 to 33 is, however, sufficiently low (preferably below about 5E13) to prevent increasing the electric field at the silicon surface.

For very high voltage terminations (about 1200 volts), a conductive field plate can also be added to the last rings shown in dotted lines as conduction field plates 50 and 51 in FIG. 1.

In FIG. 1, each of windows 40 to 43 may have a radial opening of 6 microns, which serves as the window to an implant of boron atoms at a total dose of preferably between about 2E12 and 5E13 atoms/cm$^2$. This is followed by a drive sufficient to diffuse P regions 30 to 33 to a depth of about 6 microns.

In one example, an 8000 Å oxide layer was grown on a Si substrate, for example, using a wet oxidation process where the oxide is grown for about 120 minutes at 1050° C. Next, using a lithographic process, resist material is exposed and developed such that the resist material exposes ring-shaped areas on the oxide. During an etch process, the exposed ring-shaped areas of oxide are removed and, during a stripping process, the resist material is removed from the oxide leaving ring-shaped windows 40–43 through the oxide. Next, a boron implant (preferably of about 2E12 cm$^2$ concentration) in which the boron ions are accelerated to about 80 KeV is performed to dispose the boron ions onto the Si substrate in the window areas 40–43. Finally, the boron is driven into the Si substrates for about 12 hours at about 1050° C.

The low concentration rings are each spaced by about 8 microns. A graded spacing may also be used. If a metal plate is used, it would preferably have a radial width of about 35 microns.

The total space required for the novel low dose ring structure is less (about 15% reduction) than that required by the prior art structure. Furthermore, the process is more easily manufactured than the prior art structure and is more reliable.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A termination structure for a semiconductor die; said semiconductor die having a body of silicon of one of the conductivity types and an upper N$^-$ epitaxial layer for receiving diffusions therein; said N$^-$ epitaxial layer having an active area diffused therein; a first electrode means connected to said active area; said active area having an outer periphery; said N$^-$ epitaxial area and said die having an outer peripheral street; said first electrode and said street being connectable to potential differences in excess of about 600 volts; said termination structure comprising a plurality of spaced concentric P type diffusion rings in said N$^-$ epitaxial layer surrounding said outer periphery of said active area to distribute the electric field between said first electrode and said street; said P type diffusion rings having a concentration produced by an implant dose of from about 2E12 to 2E13 atoms/cm$^2$ to reduce the electric field at the surface of said N epitaxial layer and to prevent their complete depletion at full reverse voltage.

2. The termination structure of claim 1 wherein said implant dose is boron.

3. The termination structure of claim 2 which has a second electrode means on the bottom of said silicon body.

4. The termination structure of claim 3 wherein said active area comprises a diode.

5. The termination structure of claim 3 wherein said active area comprises a power MOSFET.

6. The termination structure of claim 3 wherein said active area comprises an IGBT.

7. The termination structure of claim 2 wherein said P-type diffusion rings are spaced from one another by about 8 microns.

8. The termination structure of claim 1 which has a second electrode means on the bottom of said silicon body.

9. The termination structure of claim 1 which includes at least four spaced P type diffusion rings.

10. The termination structure of claim 9 wherein said P type rings have a concentration produced by a boron implant of from about 2E12 to 5E13 atoms/cm$^2$.

11. The termination structure of claim 10 which has a second electrode means on the bottom of said silicon body.

12. The termination structure of claim 10 wherein said active area comprises a diode.

13. The termination structure of claim 13 wherein said active area comprises a power MOSFET.

14. The termination structure of claim 10 wherein said active area comprises an IGBT.

* * * * *